US007290229B2

(12) United States Patent  
Baumgartner et al.

(10) Patent No.: US 7,290,229 B2
(45) Date of Patent: Oct. 30, 2007

(54) METHOD AND SYSTEM FOR OPTIMIZED HANDLING OF CONSTRAINTS DURING SYMBOLIC SIMULATION

(75) Inventors: Jason Raymond Baumgartner, Austin, TX (US); Christian Jacobi, Boblingen (DE); Viresh Paruthi, Austin, TX (US); Kai Oliver Weber, Boeblingen (DE)

(73) Assignee: International Business Machines Corporation, Armonk, NY (US)

( * ) Notice: Subject to any disclaimer, the term of this patent is extended or adjusted under 35 U.S.C. 154(b) by 448 days.

(21) Appl. No.: 11/050,592

(22) Filed: Feb. 3, 2005

(65) Prior Publication Data

US 2006/0190868 A1 Aug. 24, 2006

(51) Int. Cl.
*G06F 17/50* (2006.01)
(52) U.S. Cl. .................. 716/5; 716/4; 716/18
(58) Field of Classification Search ............ 716/3–5, 716/18; 703/13–17
See application file for complete search history.

(56) References Cited

U.S. PATENT DOCUMENTS

| 6,163,876 A * | 12/2000 | Ashar et al. .................... 716/5 |
| 7,020,856 B2 * | 3/2006 | Singhal et al. ................. 716/4 |
| 2007/0061765 A1 * | 3/2007 | Jacobi et al. .................. 716/5 |

OTHER PUBLICATIONS

H. Andersen, An Introduction to Binary Decision Diagrams, Technical University of Denmark, Oct. 1997.
R. Bryant, Graph-Based Algorithms for Boolean Function Manipulation, IEEE published Aug. 1986.
Hong et al., Safe BDD Minimization Using Don't Cares, Proceedings of the 34th Annual Conference on Design Automation, 1997, pp. 208-213.
R. Rudell, Dynamic Variable Ordering for Ordered Binary Decisions Diagrams, IEEE, 1993, pp. 42-47.
L. Turbak, Depth-First Search and Related Graph Algorithms, Wellesley College, Nov. 28, 2001.

* cited by examiner

*Primary Examiner*—Paul Dinh
(74) *Attorney, Agent, or Firm*—Casimer K. Salys; Dillon & Yudell LLP (57) ABSTRACT

A method for verifying a design through symbolic simulation is disclosed. The method comprises creating one or more binary decision diagram variables for one or more inputs in a design containing one or more state variables and building a binary decision diagram for a first node of one or more nodes of the design. A binary decision diagram for the initial state function of one or more state variables of the design is generated and the design is subsequently initialized. Binary decisions diagrams for one or more constraints are synthesized. A set of constraint values is accumulated over time by combining the binary decision diagrams for the one or more constraints with a set of previously generated binary decision diagrams for a set of constraints previously used in one or more previous time-steps. A binary decision diagram for the next state function of the one or more state variables in the design is constructed in the presence of the constraints. The one or more state variables in the design are updated by propagating the binary decision diagram for the next state function to the one or more state variables and a set of binary decision diagrams for the one or more targets in the presence of the one or more constraints is calculated. The set of binary decision diagrams for one or more targets is constrained and the design is verified by determining whether the one or more targets were hit.

20 Claims, 4 Drawing Sheets

METHOD AND SYSTEM FOR OPTIMIZED HANDLING OF CONSTRAINTS DURING SYMBOLIC SIMULATION

BACKGROUND OF THE INVENTION

This application is co-related to U.S. patent application Ser. No. 10/926,587, filed on Aug. 26, 2004, and entitled, "Method and System for Building Binary Decision Diagrams Efficiently in a Structural Network Representation of a Digital Circuit," the contents of which are incorporated herein by reference.

1. Field of the Invention

The present invention relates in general to verifying designs and in particular to representing a logic function in a decision diagram. Still more particularly, the present invention relates to a system, method and computer program product for handling constraints during symbolic simulation of a design.

2. Description of the Related Art

Formal and semiformal verification techniques provide powerful tools for discovering errors in verifying the correctness of logic designs. Formal and semiformal verification techniques frequently expose probabilistically uncommon scenarios that may result in a functional design failure. Frequently, formal and semiformal verification techniques provide the opportunity to prove that a design is correct (i.e., that no failing scenario exists).

One commonly-used approach to formal and semiformal analysis for applications operating on representations of circuit structures is to represent the underlying logical problem structurally (as a circuit graph), and then use Binary Decision Diagrams (BDDs) to convert the structural representation into a functionally canonical form.

In such an approach, in which a logical problem is represented structurally and binary decision diagrams are used to convert the structural representation into a functionally canonical form, a set of nodes for which binary decision diagrams are required to be built, called "sink" nodes, are identified. Examples of sink nodes include the output node or nodes in an equivalence checking or a false-paths analysis context. Examples of sink nodes also include targets in a property-checking or model-checking context.

Unfortunately, formal verification techniques require computational resources which are exponential with respect to the size of the design under test. In particular, many formal analysis techniques require exponential resources with respect to the number of state elements in the design under test. Semi-formal verification techniques leverage formal algorithms on larger designs by applying them only in a resource-bounded manner, though at the expense of incomplete verification coverage; generally, coverage decreases as design size increases.

Constraints are often used in verification to prune the possible input stimulus in certain states of the design. For example, a constraint may state "if the design's buffer is full, then constrain the input stimulus to prevent new transfers into the design". Semantically, the verification tool will typically discard any states for which a constraint evaluates to a 0 (i.e., the verification tool may never produce a failing scenario showing a violation of some property of the design, if that scenario does not adhere to all the constraints for all time-steps prior to the failure). In this previous example, it would be illegal for the verification tool to produce a trace of length "i" showing a violation of some property, if that trace illustrated the scenario that the buffer was full and a new transfer was initiated into the design between time 0 and i (inclusive).

Symbolic simulation is a symbolic exploration approach that has been used to exhaustively check designs for a bounded number of steps, starting at the initial states. This method verifies a set of scalar tests with a single symbolic vector. Symbolic inputs (represented as BDDs) are assigned to the inputs and propagated through the circuit to the outputs. This technique has the advantage that large input spaces are covered in parallel with a single symbolic sweep of the circuit. The bottleneck of the approach lies in the explosion of the BDD representations.

What is needed is a technique to handle constraints optimally in a sound and complete manner in a symbolic simulation setting, and thereby ensure that the sizes of intermediate BDDs are minimized with an optimal schedule for building BDDs for nodes in a netlist representation of a circuit.

SUMMARY OF THE INVENTION

A method for verifying a design through symbolic simulation is disclosed. The method comprises creating one or more binary decision diagram variables for one or more inputs in a design containing one or more state variables and building a binary decision diagram for a first node of one or more nodes of the design. A binary decision diagram for the initial state function of one or more state variables of the design is generated and the design is subsequently initialized. Binary decisions diagrams for one or more constraints are synthesized. A set of constraint values is accumulated over time by combining the binary decision diagrams for the one or more constraints with a set of previously generated binary decision diagrams for a set of constraints previously used in one or more previous time-steps. A binary decision diagram for the next state function of the one or more state variables in the design is constructed in the presence of the constraints. The one or more state variables in the design are updated by propagating the binary decision diagram for the next state function to the one or more state variables and a set of binary decision diagrams for the one or more targets in the presence of the one or more constraints is calculated. The set of binary decision diagrams for one or more targets is constrained and the design is verified by determining whether the one or more targets were hit.

BRIEF DESCRIPTION OF THE DRAWINGS

This invention is described in a preferred embodiment in the following description with reference to the drawings, in which like numbers represent the same or similar elements, as follows.

DETAILED DESCRIPTION OF A PREFERRED EMBODIMENT

The present invention provides a method, system, and computer program product to optimize handling of constraints in a symbolic simulation setting. As described below, the method of the invention minimizes the size of binary decision diagrams by factoring in constraints on a circuit as 'don't cares', resulting in an optimized handling of constraints for building binary decision diagrams for nodes in a netlist representation of a circuit. The present invention's optimization of intermediate binary decision diagrams enables significant performance improvements over the methods available in the prior art. The present invention alleviates the problems of exponential complexity and associated resource consumption by managing available resources more efficiently than conventional techniques.

Figure 1:
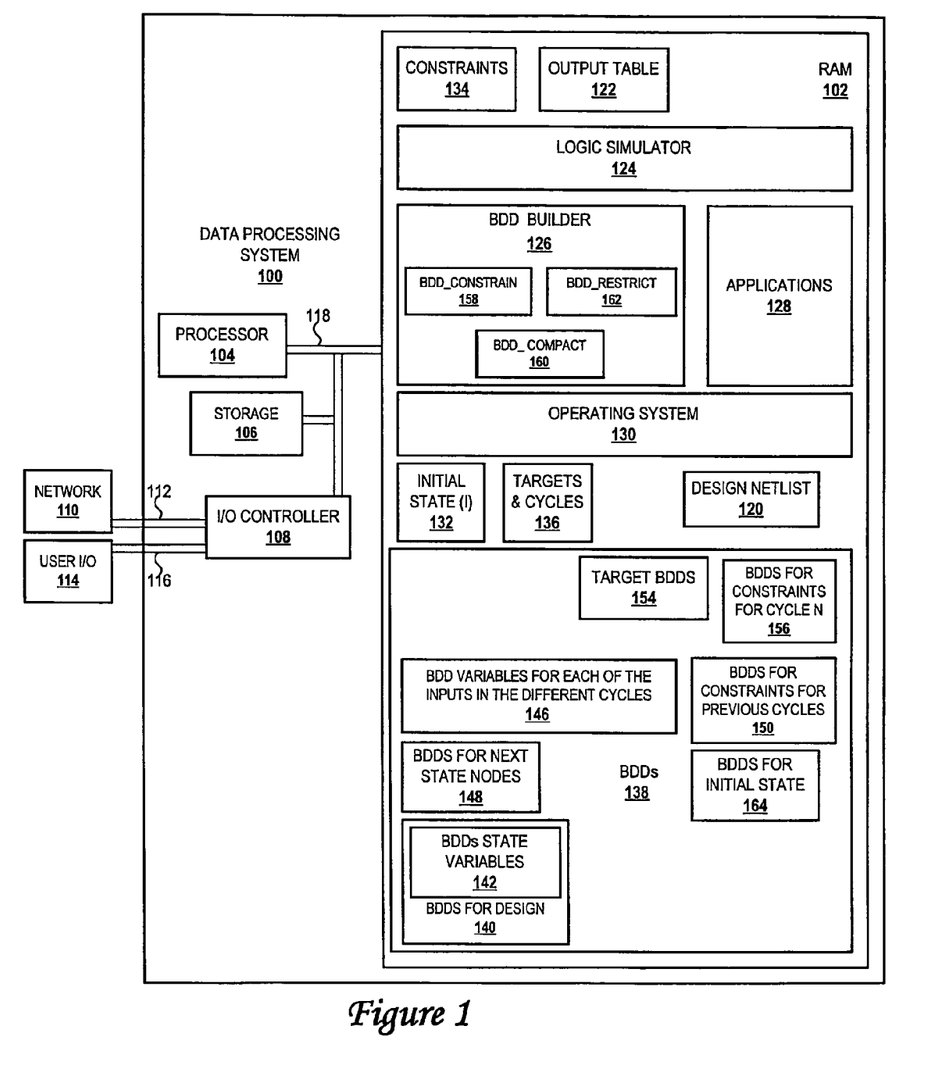
FIG. 1 is a block diagram of a general-purpose data processing system with which the present invention of a method, system and computer program product for optimized handling of constraints during symbolic simulation may be performed.

With reference now to the figures, and in particular with reference to FIG. 1, a block diagram of a general-purpose data processing system, in accordance with a preferred embodiment of the present invention, is depicted. Data processing system 100 contains a processing storage unit (e.g., RAM 102) and a processor 104. Data processing system 100 also includes non-volatile storage 106 such as a hard disk drive or other direct-access storage device. An Input/Output (I/O) controller 108 provides connectivity to a network 110 through a wired or wireless link, such as a network cable 112. I/O controller 108 also connects to user I/O devices 114 such as a keyboard, a display device, a mouse, or a printer through wired or wireless link 116, such as cables or a radio-frequency connection. System interconnect 118 connects processor 104, RAM 102, storage 106, and I/O controller 108.

Within RAM 102, data processing system 100 stores several items of data and instructions while operating in accordance with a preferred embodiment of the present invention. These include a design netlist 120 and an output table 122 for interaction with a logic simulator 124 and a binary decision diagram builder 126. Other applications 128 and logic simulator 124 interface with processor 104, RAM 102, I/O control 108, and storage 106 through operating system 130. One skilled in the data processing arts will quickly realize that additional components of data processing system 100 may be added to or substituted for those shown without departing from the scope of the present invention. Other data structures in RAM 102 include an initial state data structure 132 containing an initial state of design netlist 120, a constraints data structure 134, and a targets and cycles data structure 136 detailing operational characteristics of the simulation run by logic simulator 124.

A netlist graph, such as design netlist 120, is a popular means of compactly representing problems derived from circuit structures in computer-aided design of digital circuits. Such a representation is non-canonical and offers limited ability to analyze the function from the nodes in the graph. A netlist contains a directed graph with vertices representing gates and edges representing interconnections between those gates. The gates have associated functions, such as constants, primary inputs, combinational logic (e.g., AND gates), and sequential elements (hereafter referred to as registers). Registers have two associated components; their next-state functions and their initial-value functions, which are represented as other gates in the graph. Certain gates in the netlist may be labeled as "primary outputs", "targets", "constraints", etc.

Binary decision diagrams 138 are a popular choice for efficiently applying Boolean reasoning to problems derived from circuit structures, which are frequently represented in netlist graphs. Binary decision diagrams 138 offer a compact and canonical representation of the Boolean function of a graph node, which expedites reasoning regarding a node's function.

Processor 104 executes instructions from programs, often stored in RAM 102, in the course of performing the present invention. In a preferred embodiment of the present invention, processor 104 executes logic simulator 124. Logic simulator 124 performs the creation of binary decision diagrams 138 through the operation of binary decision diagram builder 126 on the circuit specifications contained in design netlist 120, which contains instructions for modeling a simulated item of logical hardware. Design netlist 120 contains a directed graph with vertices representing gates, and edges representing interconnections between those gates. The gates have associated functions, such as constants, primary inputs (hereafter referred to as RANDOM gates), combinational logic such as AND gates, and sequential elements (hereafter referred to as registers).

In a preferred embodiment, the present invention is applied to a netlist representation where the only combinational gate type is a 2-input AND, and inverters are represented implicitly as edge attributes. Registers have two associated components, their next-state functions, and their initial-value functions. Both are represented as other gates in design netlist 120. Semantically, for a given register, the value appearing at its initial-value gate at time '0' ("initialization" or "reset" time) will be applied as the value of the register itself; the value appearing at its next-state function gate at time "i" will be applied to the register itself at time "i+1". Certain gates are labeled as "targets" and/or "constraints".

Targets within targets and cycles 136 represent nodes whose Boolean expressions are of interest and need to be computed. The goal of the verification process is to find a way to drive a '1' on a target node, or to prove that no such assertion of the target is possible. In the former case, a "counterexample trace" showing the sequence of assignments to the inputs in every cycle leading up to the fail event getting triggered is generated and recorded to output table 122.

Logic simulator 124 includes a computer program product, stored in RAM 102 and executed on processor 104, which provides a series of tools for activities such as equivalence checking, property checking, logic synthesis and false-paths analysis. Generally speaking, logic simulator 124 contains rule-based instructions for predicting the behavior of logically modeled items of hardware.

Logic simulator 124 uses the series of rules contained in its own instructions, in conjunction with design netlist 120, to represent the underlying logical problem structurally (as a circuit graph), and uses binary decision diagram builder 126 to construct binary decision diagrams 138, thereby converting the structural representation into a functionally canonical form. In a preferred embodiment, logic simulator 124 is a Cycle-Based Symbolic Simulator (CBSS), which performs a cycle-by-cycle simulation on design netlist 120 symbolically by applying unique random, or non-deterministic, variables to the netlist inputs in every cycle.

At each step the Boolean expressions, represented as BDDs 138, corresponding to each node in design netlist 120 are computed until the expressions for all "sink" nodes (i.e. nodes labeled as primary outputs, targets, constraints and next-state functions of registers) are obtained. At each step of the simulation the Boolean expressions of the target nodes are tested for being non-zero. If so, a counterexample trace leading up to the failure (represented by the assertion of the target node to a '1') is returned. The constraints need to be factored in before this check for the targets being hit can be done. This factoring is typically accomplished by simply ANDing the Boolean expression for the target with the Boolean expression for each of the constraints.

A Cycle-Based Symbolic Simulator (CBSS), such as logic simulator 124, performs a cycle-by-cycle symbolic simulation on a netlist representation of the design in design netlist 124. Logic simulator 124 essentially performs forward BDD-based bounded symbolic simulation, starting from initial state 132. Logic simulator 124 extends the cycle simulation methodology to symbolic values. Logic simulator 124 applies symbolic functions to the inputs in every cycle and propagates them to the targets within targets and cycles data structure 136. Hence, state-variables/next-state functions and the targets are expressed in terms of the symbolic values applied in the various cycles, if the target is hit and counterexamples are generated simply by assigning concrete values to the symbolic values in the cycles leading up to the fail. As can be expected, BDD-based symbolic simulation can be computationally intensive; in the worst case BDD sizes are exponential with respect to the number of inputs of the design and the depth of the simulation. This exponential expansion may practically limit the number of cycles that can be checked exhaustively or the size of designs that may be symbolically simulated. Hence, primary goals during the simulation process are to keep BDD sizes of all nodes as small as possible and to retain only those BDDs 138 that are needed.

The overall symbolic simulation algorithm, which is discussed below with reference to FIG. 2, can be represented as follows:
1. cycle-num=0;
2. while (cycle-num<(no. of cycles to be simulated) && (unsolved targets remaining)) do
3. if(cycle-num==0) {Build BDDs for the initial states and initialize the design in its initial state}
4. else {Update state-vars by propagating BDDs for the next-state nodes to the state-vars}
5. Create new BDD variables for each of the inputs for the Current cycle
6. Build BDDs for the constraints; AND these BDDs to those of the constraints for any earlier time-steps to accumulate the constraint values over time.
7. Build BDDs for the targets in the presence of constraints
8. Constrain target BDDs and check for targets hit
9. Build BDDs for the next-functions in the presence of the constraints
10. endwhile Logic simulator 124 records results in output table 122. Logic simulator 124 may also report the contents of output table 122 or the status selected indicators of the status of design netlist 120 to user I/O 114 or applications 128. Additionally, all or part of logic simulator 124, operating system 130, design netlist 120, and output table 122 may, at times, be stored in storage 106 and/or in RAM 102.

A preferred embodiment of the present invention employs several types of BDDs 138 in every cycle, including BDDs for design 140 containing BDDs for state variables 142, BDDs for targets 154, BDDs for variables for each of the inputs of the current cycle 146, BDDs for next-state nodes 148, BDDs for constraints for previous cycles 150, and BDDs for constraints 156.

In summary, a preferred embodiment applies constraints 134 as follows:

First, when computing the Boolean expression, represented as BDDs 138, for each of the nodes in design netlist 120, BDD builder 126 applies constraints 134 as don't-cares in an attempt to reduce the sizes of BDDs 138 and thus the overall memory requirements. In a sense, this 'don't-caring' heuristically factors in constraints 134 early in the process of building BDDs 138, and, in so doing helps to reduce the Boolean expression representation of intermediate nodes.

Second, constraints 134 are applied as don't-cares by using one of three operations within BDD builder 126: bdd-constrain, bdd-restrict and bdd-compact (in that order). BDD builder 126 applies the cheapest, or the least computationally intensive don't-caring operation (bdd-constrain) first and, based on size thresholds, dynamically switches to more expensive functions. This use of multiple operations by BDD builder 126 creates a dynamic compromise between the time requirement and the memory requirement (as the more expensive 'don't-caring' operations take longer, but are more optimal i.e., render larger reductions in BDD 138 size).

Finally, constraints 134 are applied as "hard-constraints", or ANDed with the target BDDs 154 obtained for the target nodes, before they are checked for having been hit.

Constraints 134 are used to "artificially" limit the stimulus that can be applied to the RANDOM gates of the design; in particular, when searching for a way to drive a '1' to a target, the verification process must adhere to the rule that "every constraint gate must evaluate to a logical "1" for every time-step up to and including the time-step at which the target is asserted"; valuations for which the constraint gate evaluates to a '0' are considered invalid. For example, a constraint 134 could be added which drives a '1' exactly when a vector of RANDOM gates evaluates to even parity. Without this constraint, the verification tool would consider valuations with even or odd parity to those RANDOM gates; with the constraint, only even parity would be explored. In this sense, constraints impose "hard restrictions" to the evaluations performed by the verification tool; there is no freedom to selectively enforce or ignore the constraints when evaluating targets.

Constraints 134 at intermediate points in the evaluation are treated as don't cares. The constraints define a care-set for the valuations to the RANDOM gates when evaluating the targets, and all values outside of the care-set (e.g., where the constraint evaluates to false) may be added/discarded at intermediate points. This don't-caring simplifies the evaluation process and peak BDD sizes. Later, prior to evaluating the targets, the constraints 134 are used as hard restrictions on the resulting BDDs 138, which are already smaller due to the prior don't-caring, ensuring that verification semantics are strictly preserved.

Coupled with the resource constrained interleaved DFS/BFS schedule as described in co-related U.S. patent application Ser. No. 10/926,587, filed on Aug. 26, 2004, and entitled, "Method and System for Building Binary Decision Diagrams Efficiently in a Structural Network Representation of a Digital Circuit," the technique of the current invention ensures an optimal BDD building schedule in the presence of constraints. In a preferred embodiment of the present invention, binary decision diagrams are efficiently built by binary decision diagram builder 126 for designated sink nodes contained within a structural graph representation of a problem derived from circuit structure.

By switching between depth-first and modified breadth-first methods for building binary decision diagrams as described in the above-referenced patent application, the method of the preferred embodiment dynamically adjusts resource utilization parameters to converge on a heuristically-optimized schedule. The method of switching between depth-first and modified breadth-first methods for building binary decision diagrams includes setting a first size limit for a first set of one or more m-ary decision representations describing a logic function and setting a second size limit for a second set of one or more m-ary decision representations describing a logic function. The first set of m-ary decision representations of the logic function is then built with one of the set of a depth-first technique or a breadth-first technique until the first size limit is reached, and a second set of m-ary decision representations of the logic function is built with the other technique until the second size limit is reached. In response to determining that a union of first set and the second set of m-ary decision representations do not describe the logic function, the first and second size limits are increased, and the steps of building the first and second set are repeated. In response to determining that the union of the first set of m-ary decision representations and the second set of m-ary decision representations describe the logic function, the union is reported.

The method of the preferred embodiment allows BDD builder 126 to suspend construction of a given binary decision diagram by either of a depth-first or a breadth-first method, when the binary decision diagram under construction exceeds a certain pre-determined size threshold, and return later, with higher resource limits, to building the abandoned binary decision diagram. In this manner, by building smaller binary decision diagrams first, the preferred embodiment enables use of Dynamic Variable Ordering (DVO) algorithms, which attempt to compute a variable order that reduces the number of live binary decision diagram nodes, to converge on the best order needed for building all of the binary decision diagrams needed for a particular circuit. The method of building binary decision diagrams of the present invention is optimized by building smaller binary decision diagrams before building larger binary decision diagrams. Building smaller builder decision diagrams before building larger builder decision diagrams significantly reduces overall runtime and memory requirements.

Figure 2:
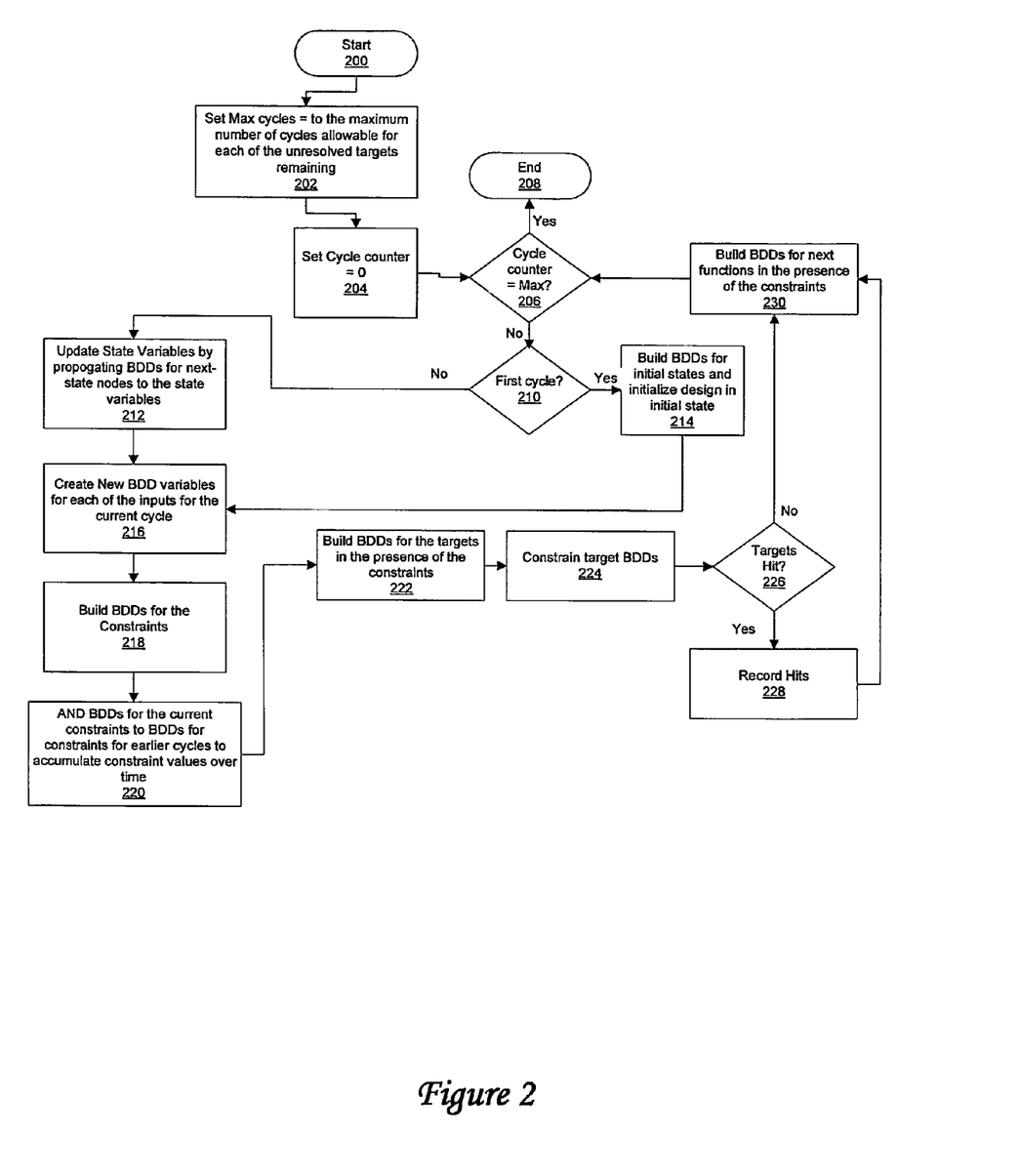
FIG. 2 is a flow diagram of a process for optimized handling of constraints during symbolic simulation, in accordance with the preferred embodiment of the present invention.

Turning now to FIG. 2, a flow diagram of a process for optimized handling of constraints during symbolic simulation, in accordance with the preferred embodiment of the present invention, is depicted. The process starts at step 200 and then moves to step 202, which depicts logic simulator 124 setting a variable for the maximum number of cycles to a value appropriate to the maximum number of cycles allowable for each of the unresolved targets remaining. The process next proceeds to step 204. At step 204, logic simulator 124 sets a cycle counter equal to zero. The process then moves to step 206, which illustrates logic simulator 124 determining whether the current value of the cycle counter equals the maximum number of cycles set in step 202. If the current value of the cycle counter is equal to the maximum number of cycles set in step 202, then the process ends at step 208. If the cycle counter does not equal the maximum numbers of cycles set in step 202, then the process next proceeds to step 210.

At step 210, logic simulator 124 determines whether the current cycle is the first cycle. If the current cycle is not the first cycle, the process next moves to step 212, which illustrates logic simulator 124 updating BDDs for state variables 142 by propagating BDDs for next state nodes 148 to BDDs for state variables 142. Returning to step 210, if logic simulator 124 determines that the current cycle is the first cycle, then the process moves to step 214. At step 214, BDD builder 126 reviews initial state 132 for design netlist 120 and builds BDDs for initial state 164. Logic simulator 124 then initializes the design from design netlist 120 in its initial state by incorporating BDDs for initial state 164 into BDDs for design 140. The process then proceeds to step 216, which is described below.

From step 212, the process next moves to step 216, which depicts BDD builder 126 creating new BDD variables for the each of the inputs of the current cycle 146. The process then proceeds to step 218. At step 218, BDD builder 126 builds BDDs for constraints for cycle n 156. The process next moves to step 220, which illustrates logic simulator 124 performing an AND operation between BDDs for constraints for previous cycles 150 and BDDs for constraints for cycle n 156 to accumulate constraint values over time. Note that if, at any point in time, the BDD for a constraint 156 is equal to zero, this state implies that the design does not have a legal state-space beyond this time-step and any unsolved targets are trivially unreachable, which may be handled during step 220 above. The process then proceeds to step 222.

At step 222, binary decision diagram builder 126 builds BDDs for the targets 154. The process next moves to step 224, which depicts logic simulator 124 constraining target BDDs. The process then proceeds to step 226. At step 226, logic simulator determines whether targets from targets and cycles data structure 136 have been hit. If targets from targets and cycles 136 have been hit, then the process next moves to step 228. At step 228, hits are recorded to output table 122. The process then proceeds to step 230, which illustrates BDD builder 126 building BDDs for the next functions in the presence of constraints.

Returning to step 226, if logic simulator 124 determines that no targets were hit, then the process next moves to step 230, which is describe above. From step 230, the process returns to step 206, which is described above.

As discussed above with reference to FIGS. 2, the present invention presents a method and system to handle constraints optimally in a symbolic simulation setting. FIG. 2 discloses a broad method for building BDDs constraints in cycle n 156 and using them as don't-cares (during steps 222-230) to minimize the BDDs created for next state nodes 148. In steps 224-226 the present invention applies constraints 134 as hard restrictions to the target BDDs 154, such that any behaviors precluded by the constraints 134 are "weeded out" when checking the targets for being hit.

Note that, in a CBSS approach, the BDDs for the targets 154, BDDs for constraints 156, and next-state nodes 148 for functions and registers in any cycle always are a function of the inputs applied at the current and previous cycles; the BDDs at these nodes represent the possible values these nodes may assume at any point in time in terms of all possible inputs applied to the design in the different cycles.

In a preferred embodiment, the building of BDDs for sinks, i.e. "end-points", in a netlist representation of the design—such as targets and next-state functions, is handled in a levelized manner as described above. As described above, the technique relies on building BDDs for each node in the representation until BDDs for the sinks are obtained. That technique may be enhanced using the present invention to additionally factor in constraints 134. The present invention treats the BDDs for the constraints for cycle n 156 as don't-cares to minimize the size of the BDD at each node, (i.e. behaviors outside of the specified constraint are a don't-care and hence may assume either a '0' or a '1' value). Factoring in the constraints 134 as hard restrictions may actually lead to an increase in the BDD size during intermediate computations. Hence, the present invention relies on treating the constraints as don't-cares by using safe BDD minimization algorithms, which are known in the art. Such algorithms ensure that the constraints are adhered to, but for all values outside of the care-set defined by the constraint they are free to chose a '0' or a '1' value towards the goal of minimizing the size of the BDD. The behaviors added will ultimately be eliminated during that final stage as well.

The approach for building intermediate BDDs using don't cares is summarized below for a hypothetical 2-input AND/INVERTER representation where the only gates in the netlist are 2-input AND gates, RANDOM gates, constant gates, and registers and inversions are edge attributes. Evaluating RANDOM gates correlates to creating a new BDD variable for each RANDOM gate for each time-step. Evaluating a constant gate correlates to merely creating the corresponding constant BDD. Evaluating registers correlates to either evaluating their initial value cone (at time 0) or sampling their next-state function BDDs from the prior cycle.

Figure 3:
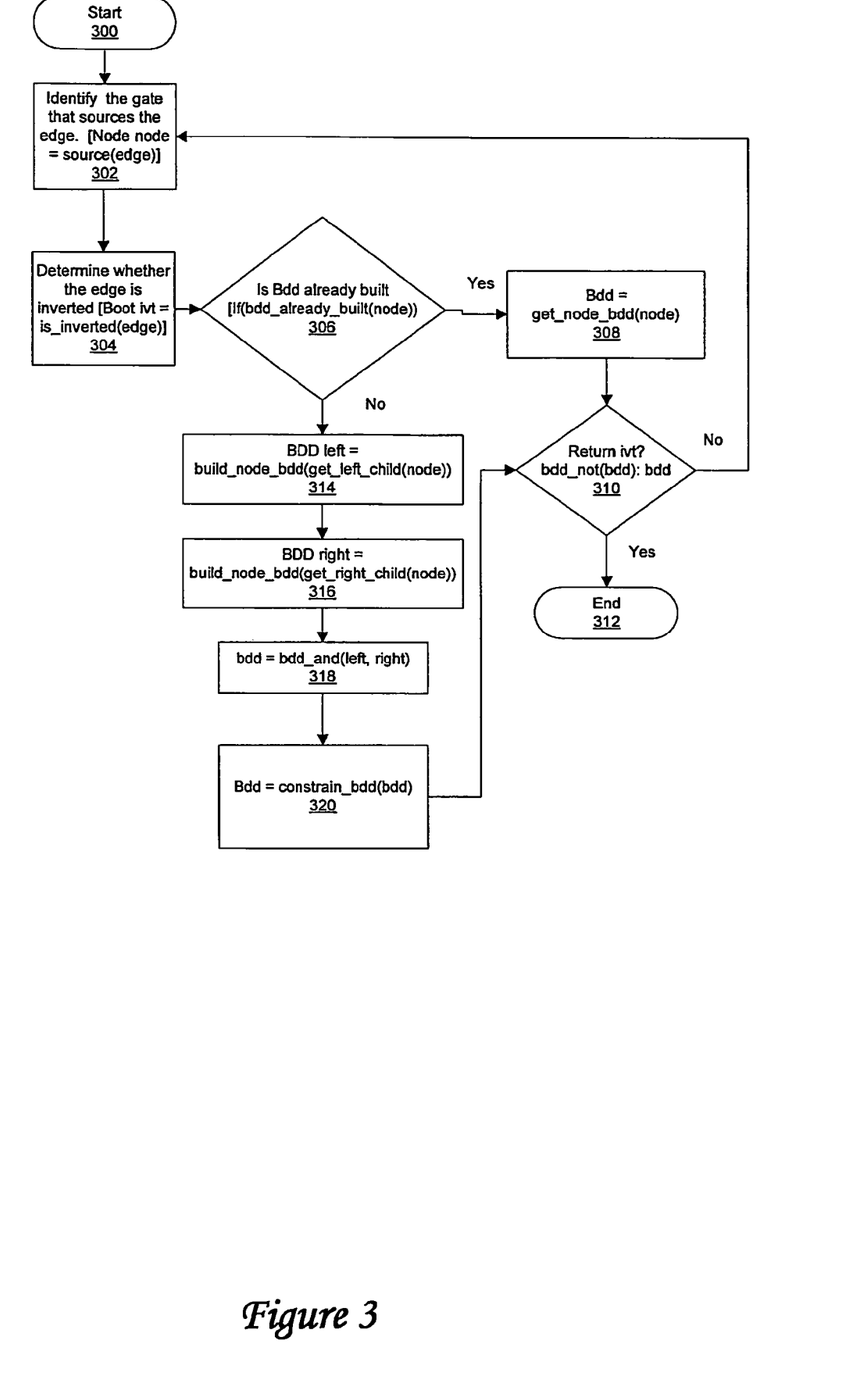
FIG. 3 is a flow diagram of a process for building constrained binary decision diagrams with optimized handling of constraints during symbolic simulation, in accordance with the preferred embodiment of the present invention.

The method discussed with respect to FIG. 3 can be alternatively discussed as an algorithm, which can be represented as follows:

1. Function build-node-bdd(Edge edge)
2. Node node=source(edge); [see the gate which sources the edge]
3. bool ivt=is-inverted(edge); [see if the edge was inverted]
4. If(bdd-already-built(node)) bdd=get-node-bdd(node); [check if already built]
5. else {
6. BDD left=build-node-bdd(get-left-child(node));
7. BDD right=build-node-bdd(get-right-child(node));
8. bdd=bdd-and(left, right);
9. bdd=constrain-bdd(bdd);
10. }
11. return ivt? bdd-not(bdd): bdd;

The algorithm illustrated above is one alternative embodiment of the process described below with respect to FIG. 3. Referring now to FIG. 3, which elaborates upon step 218, step 230 and step 222 of FIG. 2, a flow diagram of the process for building constrained binary decision diagrams with optimized handling of constraints during symbolic simulation, in accordance with the preferred embodiment of the present invention is illustrated. The process starts at step 300. The process next proceeds to step 302. At step 302, BDD builder 126 identifies the gate that sources an individual edge. The process then moves to step 304, which depicts BDD builder 126 determining whether the edge under consideration is inverted and next proceeds to step 306. At step 306, BDD builder 126 determines whether a BDD has already been built for the node under consideration. If a BDD has been built for the node under consideration, then the process next moves to step 308, which illustrates BDD builder 126 getting the BDD for the current node. The process then proceeds to step 310.

At step 310, binary decision diagram builder 126 determines whether to return the IVT, representing whether the edge is inverted. If binary decision diagram builder 126 determines to return the IVT, then the process ends at step 312. If the binary decision diagram builder 126 determines not to return the IVT then the process returns to step 302, which is described above.

Returning to step 306, if BDD builder 126 determines that a BDD for the current node is not already built, then the process proceeds to step 314, which depicts BDD builder defining the left half of the BDD in terms of its left child nodes. The process next moves to step 316. At step 316, BDD builder 126 builds the right half of the BDD for the current node in terms of the nodes' child nodes. The process then moves to step 318, which illustrates binary decision diagram builder combining the left and right halves. The process next moves to step 320. At step 320, binary decision diagram builder 126 constrains the BDD assembled in steps 314 through 318.

Figure 4:
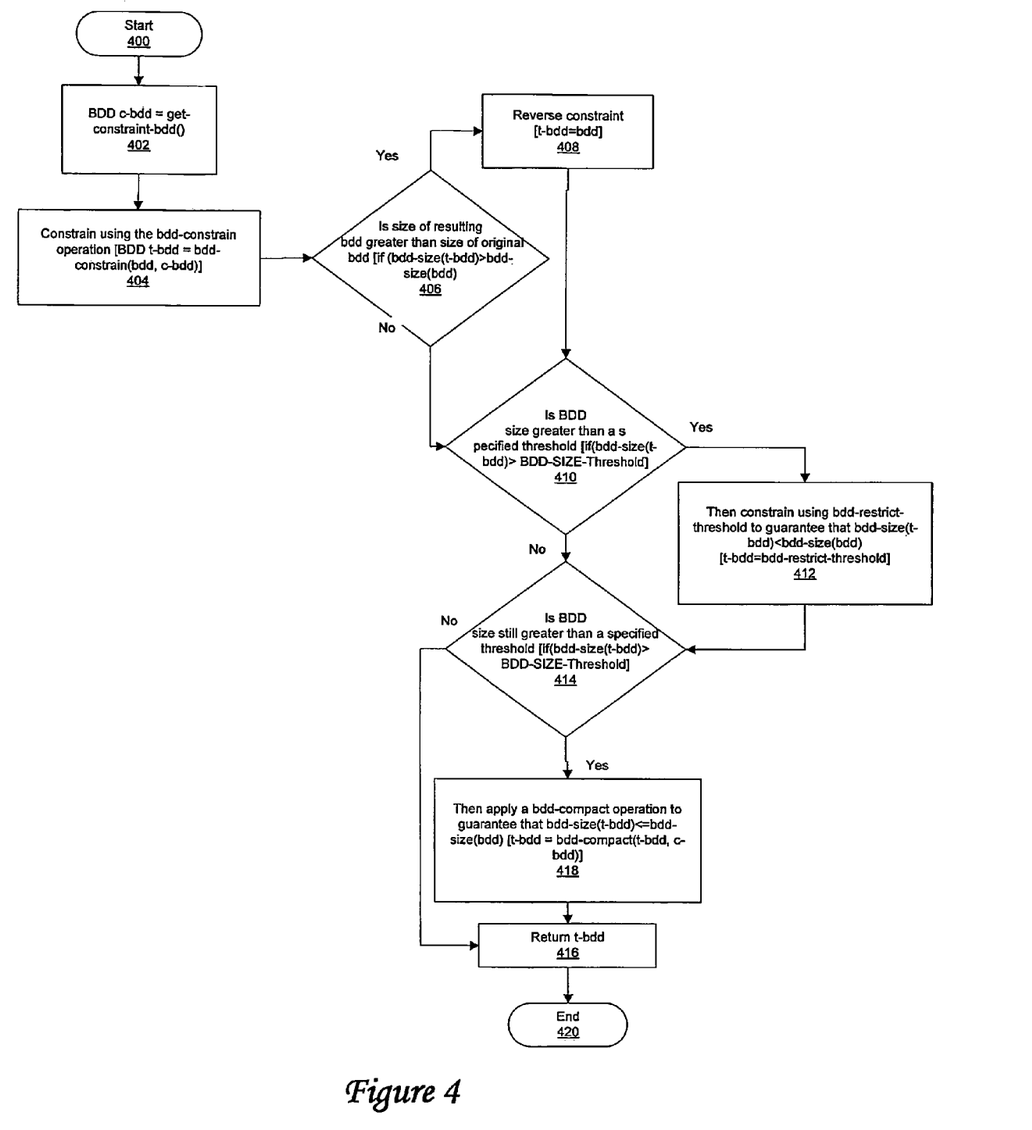
FIG. 4 is a flow diagram of a process for constraining binary decision diagrams with optimized handling of constraints during symbolic simulation, in accordance with the preferred embodiment of the present invention.

As described in the algorithm below and with respect to FIG. 4, the present invention performs don't-caring by applying one of three minimization algorithms, in order of increasing computational complexity—bdd-constrain, bdd-restrict and bdd-compact. The present invention extends this technique further by dynamically switching between each of these minimization techniques based on thresholds for the required reduction in the size of the BDD at the node.

The overall use of the minimization algorithms, which will be discussed with reference to FIG. 4, can be alternatively represented as follows:

1. Function constrain-bdd(BDD bdd)
2. Begin
3. BDD c-bdd=get-constraint-bdd0;
4. BDD t-bdd=bdd-constrain(bdd, c-bdd) [constrain using the bdd-constrain operation]
5. if(bdd-size(t-bdd)>bdd-size(bdd)) t-bdd=bdd [undo constrain if size of resulting BDD exceeds the size of the original BDD]
6. if(bdd-size(t-bdd)>BDD-SIZE-THRESHOLD) [if size of BDD is greater than a specified threshold]
7. t-bdd=bdd-restdct-threshold(t-bdd, c-bdd) [then constrain using bdd-restrict-threshold—this operation guarantees that bdd-size(t-bdd)<=bdd-size(bdd)]
8. if(bdd-size(t-bdd)>BDD-SIZE-THRESHOLD) [if size of BDD still exceeds the specified threshold]
9. t-bdd=bdd-compact(t-bdd, c-bdd) [then apply the bdd-compact operation—this operation too guarantees that bdd-size(t-bdd)<=bdd-size(bdd)]
10. return t-bdd;
11. End Referring now to FIG. 4, which elaborates upon step 222 and 230 of FIG. 2 a flow diagram of a process for constraining binary decision diagrams with optimized handling of constraints during symbolic simulation, in accordance with the preferred embodiment of the present invention is depicted. The process starts at step 400, the process next proceeds to step 402. At step 402, BDD builder 126 performs the operation c-bdd=get-constraint-bdd. The process then moves to step 404, which depicts BDD builder 126 constraining the current BDD received in step 402 using the BDD constraint operation 158. The process next proceeds to step 406. At step 406, BDD builder 126 determines whether the size of the resulting BDD from step 404 is greater than the size of the original BDD in step 402. If the size of the resulting BDD in step 404 is greater than the size of the original BDD in step 402, then the process moves to step 408, which illustrates BDD builder 126 reversing the constrained operation performed in step 404. The process next proceeds to step 410. If, at step 406, BDD builder 126 determines that the size of resulting BDD from step 404 is not greater than the size of the original BDD in step 402, then the process moves to step 410.

At step 410, binary decision diagram builder 126 determines whether the size of the BDD under consideration is greater than a specified threshold. If the size of the BDD under consideration is greater than the specified threshold, then the process moves to step 412. At step 412, BDD builder 126 constrains the current BDD using a bdd-restrict function 126 that guarantees that the BDD size is not greater than the size of the original BDD. The process then proceeds to step 414. If, at step 410, the BDD is not greater than the specified threshold, then the process moves to step 414.

At step 414, BDD builder 126 determines whether the size of the BDD under consideration is still greater than the specified threshold. If the size of the BDD is not still greater than the specified threshold, then the process next proceeds to step 416, which depicts BDD builder returning the current BDD to logic simulator. If, at step 414, the size of the BDD under consideration is still greater than the specified threshold, then the process moves to step 418. At step 418, binary decision diagram builder applies a BDD compact operation 160 to minimize the size of the BDD. The process then proceeds to step 416, which is described above. From step 416, the process ends at step 420.

Note that the present invention guaranteed that the size of the BDD at a node will not increase. If at all, the BDD size will decrease—possible dramatically—and facilitate building of subsequent larger BDDs which may otherwise be infeasible due to an explosion in the size of the BDD. In a sense, the present invention removes and/or adds behaviors precluded by the constraints early on by a smart application of the constraints during intermediate BDD building as opposed to doing this only at the end once all the "exact" BDDs have been built. Any such don't-caring first checks for the intersection of the cone-of-influence of the constraints with the cone-of-influence of the node, and applies only those constraints at the node as don't-cares that do have some overlap (otherwise the constraint does not influence the function at the node in any way).

Finally, the target BDDs 154—built using don't cares as per the above algorithms—are hard-restricted with the BDDs for the constraints 156 before checking whether they are hit. This hard-restriction is accomplished by ANDing the constraint BDD 156 with the BDD 154 for the targets, thus disallowing all behaviors outside of those specified as legal by the constraints. Note that it is safe to perform such a hard-constraining (as opposed to don't-caring) at the targets only, versus at all intermediate nodes, because the targets are the only points of "externally visible design behavior" while all other nodes are internal to the design. The constraining can thus be strictly enforced only at the targets without risking the verification toolset producing an illegal result which violates the constraints. The bdd-AND operation restricts the valuations at the targets to the care-set defined by the constraint, and rules out behaviors that violate this set, or lie outside of this set—some of which may have been introduced by the earlier don't caring of our invention for optimality, and some of which are intrinsic in the netlist and are disallowed only by the presence of the constraints.

While described for a sequential design, this invention is directly applicable to building BDDs for a combinational problem that does not contain any registers.

The present invention provides a method, system, and computer program product to optimize handling of constraints in a symbolic simulation setting. As described above, the method of the invention minimizes the size of intermediate binary decision diagrams by factoring in constraints on a circuit as 'don't cares', resulting in an optimized handling of constraints for building binary decision diagrams for nodes in a netlist representation of a circuit. The present invention's optimization of intermediate binary decision diagrams enables significant performance improvements over the methods available in the prior art. The present invention alleviates the problems of exponential complexity and associated resource consumption by managing available resources more efficiently than conventional techniques.

In the preceding detailed description of exemplary embodiments of the invention, specific exemplary embodiments in which the invention may be practiced are described in sufficient detail to enable those skilled in the art to practice the invention, and it is to be understood that other embodiments may be utilized and that logical, architectural, programmatic, mechanical, electrical and other changes may be made without departing from the spirit or scope of the present invention. The preceding detailed description is, therefore, not to be taken in a limiting sense, and the scope of the present invention is defined only by the appended claims. In particular, although the preferred embodiment is described below with respect to a software system, it will be appreciated that the present invention is not limited to software implementations. It will be appreciated by one of ordinary skill in the art that the method described above will typically be carried out in software running on one or more processors (not shown), and that the software may be provided as a computer program element carried on any suitable data carrier (also not shown) such as a magnetic or optical computer disc. The channels for the transmission of data likewise may include storage media of all descriptions as well as signal carrying media, such as wired or wireless signal media.

Accordingly, the present invention may suitably be embodied as a computer program product for use with a computer system. Such an implementation may comprise a series of computer readable instructions either fixed on a tangible medium, such as a computer readable medium, for example, diskette, CD-ROM, ROM, or hard disk, or transmittable to a computer system, via a modem or other interface device, over either a tangible medium, including but not limited to optical or analog communications lines, or intangibly using wireless techniques, including but not limited to microwave, infrared or other transmission techniques. The series of computer readable instructions embodies all or part of the functionality previously described herein.

Those skilled in the art will appreciate that such computer readable instructions can be written in a number of programming languages for use with many computer architectures or operating systems. Further, such instructions may be stored using any memory technology, present or future, including but not limited to, semiconductor, magnetic, or optical, or transmitted using any communications technology, present or future, including but not limited to optical, infrared, or microwave. It is contemplated that such a computer program product may be distributed as a removable medium with accompanying printed or electronic documentation, for example, shrink-wrapped software, preloaded with a computer system, for example, on a system RON or fixed disk, or distributed from a server or electronic bulletin board over a network, for example, the Internet or World Wide Web.

What is claimed is:

1. A method for verifying a design through symbolic simulation, said method comprising:

creating one or more binary decision diagram variables for one or more inputs of a next state of a design containing one or more state variables;

building a binary decision diagram for a first node of one or more nodes in said design;

generating a binary decision diagram for an initial state function of one or more state variables of said design;

synthesizing one or more binary decision diagrams for one or more constraints;

accumulating a set of constraint values over time by combining said binary decision diagrams for said one or more constraints with a set of previously generated binary decision diagrams for a set of constraints previously used in one or more previous time-steps;

constructing a binary decision diagram for said next state function of said one or more state variables in said design;

updating said one or more state variables in said design by propagating said binary decision diagram for said next state function to said one or more state variables;

calculating a set of binary decision diagrams for said one or more targets in the presence of said one or more constraints;

constraining said set of binary decision diagrams for one or more targets; and verifying said design by determining whether said one or more targets were hit.

2. The method according to claim 1, wherein the step of calculating a set of binary decision diagrams for said one or more targets in the presence of said one or more constraints, further comprises:

ascertaining whether said binary decision diagram for said one or more targets in the presence of said one or more constraints is already built;

building one or more portions of said binary decision diagram for said one or more targets in the presence of said one or more constraints by fetching one or more child nodes; and combining said one or more portions of said binary decision diagram for said one or more targets; and in response to determining that said binary decision diagram for said one or more targets in the presence of said one or more constraints is already built, fetching said binary decision diagram for said one or more targets.

3. The method according to claim 1, wherein the step of calculating a set of binary decision diagrams for said one or more targets in the presence of said one or more constraints, further comprises:

in response to determining that said binary decision diagram for said one or more targets in the presence of said one or more constraints is already built, fetching said binary decision diagram for said one or more targets.

4. The method according to claim 1, wherein the step of calculating a set of binary decision diagrams for said one or more targets in the presence of said one or more constraints, further comprises:

constraining said set of binary decision diagrams for said one or more targets in the presence of said one or more constraints.

5. The method according to claim 1, wherein the step of constraining said set of binary decision diagrams for said one or more targets, further comprises:

fetching a binary decision diagram for a constraint;

employing a constrain operation to generate a constrained binary decision diagram;

determining whether a size of said constrained binary decision diagram exceeds a size of said binary decision diagram before employing said constrain operation; and responsive to determining that said size of said constrained binary decision diagram exceeds a size of said binary decision diagram before employing said constrain operation, reversing said constrain operation.

6. The method according to claim 1, wherein the step of constraining said set of binary decision diagrams for said one or more targets, further comprises:

determining whether a size of said constrained binary decision diagram exceeds a threshold;

responsive to determining that said size of said constrained binary decision diagram exceeds said threshold, applying a restrict operation; and responsive to determining that said size of said constrained binary decision diagram exceeds said threshold, applying a restrict operation.

7. The method according to claim 1, further comprising:

setting a first size limit for a first set of one or more m-ary decision representations describing a logic function;

setting a second size limit for a second set of one or more m-ary decision representations describing a logic function;

building said first set of m-ary decision representations of said logic function with one of the set of a depth-first technique or a breadth-first technique until said first size limit is reached;

building a second set of m-ary decision representations of said logic function with the other of the set of a depth-first technique or a breadth-first technique until said second size limit is reached;

in response to determining that a union of first set and said second set of m-ary decision representations do not describe said logic function, increasing said first size limit, increasing said second size limit, and repeating said step of building said first set and said step of building said second set; and in response to determining that said union of said first set of m-ary decision representations and said second set of m-ary decision representations describes said logic function, reporting the union of said first set of said first set of m-ary decision representations and said second set of m-ary decision representations.

8. A system for verifying a design through symbolic simulation, said system comprising:

means for building a binary decision diagram for a first node of one or more nodes in a design containing one or more state variables;

means for creating one or more binary decision diagram variables for one or more inputs of a next state of said design;

means for generating a binary decision diagram for an initial state function of one or more state variables of said design;

means for constructing a binary decision diagram for said next state function of said one or more state variables in said design;

means for updating said one or more state variables in said design by propagating said binary decision diagram for said next state function to said one or more state variables;

means for synthesizing one or more binary decision diagrams for one or more constraints;

means for accumulating a set of constraint values over time by combining said binary decision diagrams for said one or more constraints with a set of previously generated binary decision diagrams for a set of constraints previously used in one or more previous timesteps;

means for calculating a set of binary decision diagrams for said one or more targets in the presence of said one or more constraints;

means for constraining said set of binary decision diagrams for one or more targets; and means for verifying said design by determining whether said one or more targets were hit.

9. The system according to claim 8, wherein the means for calculating a set of binary decision diagrams for said one or more targets in the presence of said one or more constraints, further comprises:

means for ascertaining whether said binary decision diagram for said one or more targets in the presence of said one or more constraints is already built;

means for building one or more portions of said binary decision diagram for said one or more targets in the presence of said one or more constraints by fetching one or more child nodes; and means for combining said one or more portions of said binary decision diagram for said one or more targets; and means, in response to determining that said binary decision diagram for said one or more targets in the presence of said one or more constraints is already built, fetching said binary decision diagram for said one or more targets.

10. The system according to claim 8, wherein the means for calculating a set of binary decision diagrams for said one or more targets in the presence of said one or more constraints, further comprises:

means, in response to determining that said binary decision diagram for said one or more targets in the presence of said one or more constraints is already built, fetching said binary decision diagram for said one or more targets.

11. The system according to claim 8, wherein the means for calculating a set of binary decision diagrams for said one or more targets in the presence of said one or more constraints, further comprises:

means for constraining said set of binary decision diagrams for said one or more targets in the presence of said one or more constraints.

12. The system according to claim 8, wherein the means for constraining said set of binary decision diagrams for said one or more targets, further comprises:

means for fetching a binary decision diagram for a constraint;

means for employing a constrain operation to generate a constrained binary decision diagram;

means for determining whether a size of said constrained binary decision diagram exceeds a size of said binary decision diagram before employing said constrain operation; and means, responsive to determining that said size of said constrained binary decision diagram exceeds a size of said binary decision diagram before employing said constrain operation, reversing said constrain operation.

13. The system according to claim 8, wherein the means for constraining said set of binary decision diagrams for said one or more targets, further comprises:

means for determining whether a size of said constrained binary decision diagram exceeds a threshold;

means, responsive to determining that said size of said constrained binary decision diagram exceeds said threshold, applying a restrict operation; and means, responsive to determining that said size of said constrained binary decision diagram exceeds said threshold, applying a restrict operation.

14. The system according to claim 8, further comprising:

means for setting a first size limit for a first set of one or more m-ary decision representations describing a logic function;

means for setting a second size limit for a second set of one or more m-ary decision representations describing a logic function;

means for building said first set of m-ary decision representations of said logic function with one of the set of a depth-first technique or a breadth-first technique until said first size limit is reached;

means for building a second set of m-ary decision representations of said logic function with the other of the set of a depth-first technique or a breadth-first technique until said second size limit is reached;

means, in response to determining that a union of first set and said second set of m-ary decision representations do not describe said logic function, means for increasing said first size limit, means for increasing said second size limit, and means for repeating said system for building said first set and said system for building said second set; and means, in response to determining that said union of said first set of m-ary decision representations and said second set of m-ary decision representations describes said logic function, reporting the union of said first set of said first set of m-ary decision representations and said second set of m-ary decision representations.

15. A computer program product in a computer-readable medium for verifying a design through symbolic simulation, said computer program product comprising:

a computer-readable medium;

instructions on the computer-readable medium for building a binary decision diagram for a first node of one or more nodes in a design containing one or more state variables;

instructions on the computer-readable medium for creating one or more binary decision diagram variables for one or more inputs of a next state of said design;

instructions on the computer-readable medium for generating a binary decision diagram for an initial state function of one or more state variables of said design;

instructions on the computer-readable medium for constructing a binary decision diagram for said next state function of said one or more state variables in said design;

instructions on the computer-readable medium for updating said one or more state variables in said design by propagating said binary decision diagram for said next state function to said one or more state variables;

instructions on the computer-readable medium for synthesizing one or more binary decision diagrams for one or more constraints;

instructions on the computer-readable medium for accumulating a set of constraint values over time by combining said binary decision diagrams for said one or more constraints with a set of previously generated binary decision diagrams for a set of constraints previously used in one or more previous time-steps;

instructions on the computer-readable medium for calculating a set of binary decision diagrams for said one or more targets in the presence of said one or more constraints;

instructions on the computer-readable medium for constraining said set of binary decision diagrams for one or more targets; and instructions on the computer-readable medium for verifying said design by determining whether said one or more targets were hit.

16. The computer program product according to claim 15, wherein the instructions for calculating a set of binary decision diagrams for said one or more targets in the presence of said one or more constraints, further comprises:

instructions on the computer-readable medium for ascertaining whether said binary decision diagram for said one or more targets in the presence of said one or more constraints is already built;

instructions on the computer-readable medium for building one or more portions of said binary decision diagram for said one or more targets in the presence of said one or more constraints by fetching one or more child nodes; and instructions on the computer-readable medium for combining said one or more portions of said binary decision diagram for said one or more targets; and instructions, in response to determining that said binary decision diagram for said one or more targets in the presence of said one or more constraints is already built, fetching said binary decision diagram for said one or more targets.

17. The computer program product according to claim 15, wherein the instructions for calculating a set of binary decision diagrams for said one or more targets in the presence of said one or more constraints, further comprises:

instructions, in response to determining that said binary decision diagram for said one or more targets in the presence of said one or more constraints is already built, fetching said binary decision diagram for said one or more targets.

18. The computer program product according to claim 15, wherein the instructions for calculating a set of binary decision diagrams for said one or more targets in the presence of said one or more constraints, further comprises:

instructions on the computer-readable medium for constraining said set of binary decision diagrams for said one or more targets in the presence of said one or more constraints.

19. The computer program product according to claim 15, wherein the instructions for constraining said set of binary decision diagrams for said one or more targets, further comprises:

instructions on the computer-readable medium for fetching a binary decision diagram for a constraint;

instructions on the computer-readable medium for employing a constrain operation to generate a constrained binary decision diagram;

instructions on the computer-readable medium for determining whether a size of said constrained binary decision diagram exceeds a size of said binary decision diagram before employing said constrain operation; and instructions, responsive to determining that said size of said constrained binary decision diagram exceeds a size of said binary decision diagram before employing said constrain operation, reversing said constrain operation.

20. The computer program product according to claim 15, wherein the instructions for constraining said set of binary decision diagrams for said one or more targets, further comprises:

instructions on the computer-readable medium for determining whether a size of said constrained binary decision diagram exceeds a threshold;

instructions, responsive to determining that said size of said constrained binary decision diagram exceeds said threshold, applying a restrict operation; and instructions, responsive to determining that said size of said constrained binary decision diagram exceeds said threshold, applying a restrict operation.

* * * * *